(12) United States Patent
Varshavsky (10) Patent No.: US 6,338,157 B1
(45) Date of Patent: Jan. 8, 2002

(54) THRESHOLD ELEMENT AND METHOD OF DESIGNING THE SAME

(75) Inventor: Victor I. Varshavsky, Tokyo (JP)

(73) Assignee: Monolith Co., Ltd., Tokyo (JP)

( * ) Notice: Subject to any disclaimer, the term of this patent is extended or adjusted under 35 U.S.C. 154(b) by 0 days.

(21) Appl. No.: 09/239,776

(22) Filed: Jan. 29, 1999

(30) Foreign Application Priority Data

Jan. 30, 1998 (JP) ............................................ 10-054079

(51) Int. Cl.$^7$ ................................................ G06F 17/50
(52) U.S. Cl. .................................................. 716/2; 716/1
(58) Field of Search .......................... 716/1, 2; 326/35, 326/36, 104; 327/427, 436, 437

(56) References Cited

U.S. PATENT DOCUMENTS 5,706,226 A * 1/1998 Chan et al. .................. 365/156
5,872,030 A * 2/1999 Huang .......................... 438/210
6,198,336 B1 * 3/2001 Varshavsky .................. 327/427

OTHER PUBLICATIONS

Bohossian et al, "Programmable Neural Logic," IEEE, Oct. 1997, pp. 13–21.*
Siu et al, "Rational Approximation Techniques for Analysis of Neural Networks," IEEE, Mar. 1994, pp. 455–466.*
Varshavsky, "β–Driven Threshold Elements," IEEE, Feb. 1998, pp. 1–7.*
Varshavsky, "CMOS Artificial Neuron on the Base of β–Driven Threshold Element," IEEE, Oct. 1998, pp. 1857–1861.*
Varshavsky et al, "Implementability Restrictions of the Beta–CMOS Artificial Neuron," IEEE, Sep. 1999, pp. 401–405.*
Busta et al, "Hardware Implementation of a "Wired–Once" Neural Net in Thin–Film Technology on a Glass Substrate" IEEE, Apr. 1990, pp. 1093–1045.*

* cited by examiner

Primary Examiner—Matthew Smith
Assistant Examiner—Vuthe Siek
(74) Attorney, Agent, or Firm—Fleshner & Kim, LLP (57) ABSTRACT

A threshold element is implemented by output wired CMOS circuit. The corresponding threshold function is transformed to a form including the ratio of beta values of n- and p-transistors. Inputs are allocated to the n- and p-transistors in accordance with the ratio. The logic circuitry can be implemented with half of transistors in the similar implementation in a conventional CMOS circuitry, since every character entry corresponds to a single transistor.

19 Claims, 6 Drawing Sheets

104:NAND
106:AND

124:NOR
126:OR

FIG. 16

THRESHOLD ELEMENT AND METHOD OF DESIGNING THE SAME

BACKGROUND OF THE INVENTION

1. Field of the Invention

The present invention relates to a method of designing a threshold element, and to a threshold element designed using such a method. In particular, the invention is adapted to develop a threshold element based on an output wired CMOS (complementary metal oxide semiconductor) logic.

2. Description of the Prior Art

During the last 40 years, the tides of interest to threshold and majority logics rose and waned periodically. This was caused, on the one hand, by new circuit elements of threshold nature and, on the other hand, by the tasks which used threshold functions to specify functional blocks. There are a lot of such tasks, for example, those of reliability, threshold coding, AD/DA-conversion, filtration, etc. Of special note are neural networks, the behavior of formal neutrons in which is described by threshold functions, starting from the classic work by McCulloch and Pitts.

A threshold function is defined as $$y = \text{Sign}\left(\sum_{i=1}^{n} w_i x_i - T\right) = \begin{cases} 1 & \text{if } \sum_{i=1}^{n} w_i x_i - T \geq 0 \\ 0 & \text{if } \sum_{i=1}^{n} w_i x_i - T < 0 \end{cases} \quad (1)$$

where $w_i$ is the weight of the i-th input and T is the threshold. Thus, a threshold element should consist of an adder and a threshold comparator.

Recently, new circuits of CMOS threshold elements have been suggested and studied. A vCMOS is based on the CMOS-inverter with floating gate and capacity inputs. Another CMOS is based on output wired CMOS inverters. The latter are the subject of the present specification.

Figure 1:
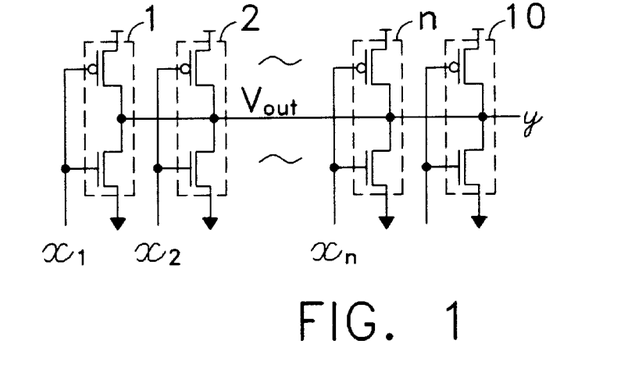
FIG. 1 illustrates a threshold element comprising conventional output wired CMOS inverters.

FIG. 1 illustrates the structure of a threshold element consisting of output wired CMOS inverters. The threshold element comprises inverters 1, 2, ..., n having inputs $x_1$, $x_2$, ..., $x_n$. Outputs of the inverters 1, 2, ..., n are wired. The output voltage Vout appears at the wired outputs. A decision inverter 10 converts the output voltage Vout into binary data which is the final result y. The threshold value of the decision inverter 10 is determined in proper manner to truly binary-code the result of the majority. The inverters 1, 2, ..., n realize an adder, while the decision inverter 10 realizes a comparator, in this circuit. The threshold element allows outputs from the inverters 1, 2, ..., n to cause the tug of war, in which the final result y becomes "1" if more binary code "1" is in put and becomes "0" if more binary code "0" is input. Thus, the inverters as a whole establish a majority circuit.

Since threshold functions are a subset of Boolean functions, any threshold function can naturally be represented by a superposition of operations (circuit elements) of any functionally full basis. The question is whether circuits can be built that would implement threshold functions in a simpler way than the traditional circuits do. If the answer is positive, it would be possible to simplify the implementations of arbitrary logic functions having a bigger number of basic elements. In CMOS-implementation, every character entry corresponds to two (p- and n-) transistors.

SUMMARY OF THE INVENTION

It is therefore an object of the present invention to provide a threshold element capable of providing the function blocks with transistors less than two for each of the inputs, and a method of designing the same.

According to the present invention, there is provided a method of designing a threshold element, comprising: converting to the form including a ratio related to p- and n-transistors a threshold function which outputs the result of comparison between a predetermined threshold value and the sum of weighted inputs; and allocating the inputs to the p- and n-transistors in accordance with the ratio, so as to design a threshold element corresponding to the threshold function.

The ratio could be a parameter to determine which of p- and n-transistors more affects on the output when the p- and n-transistors are turned on, since the ratio is related to the p- and n-transistors. In other words, the ratio could be a parameter to determine the condition of the above-mentioned tug of war.

A threshold element of the present invention can be designed using the above-mentioned designing method. When a threshold function is converted to the form including a ratio related to p- and n-transistors, respective inputs are ti allocated to the p- and n-transistors in accordance with the ratio.

BRIEF DESCRIPTION OF THE DRAWINGS

The above and other objects, features and advantages of the present invention will become apparent from the following description of the preferred embodiment in conjunction with the accompanying drawings, wherein.

DESCRIPTION OF THE PREFERRED EMBODIMENT

Figure 2:
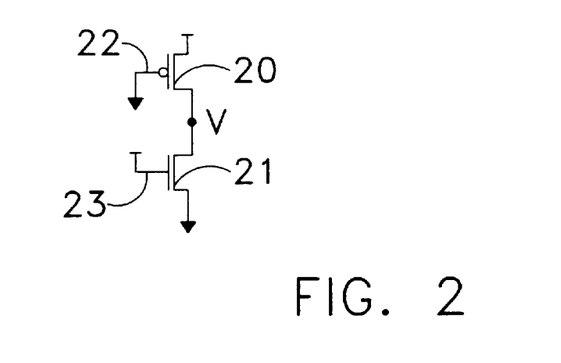
FIG. 2 illustrates the background leading to a method of designing a threshold element in accordance with an embodiment of the present invention.

FIG. 2 illustrates the background leading to a designing method of the present invention. A p-transistor or p-channel MOSFET 20 and an n-transistor or n-channel MOSFET 21 are serially connected between a power supply and a ground. The gate 22 of the p-transistor 20 is grounded, and the gate 23 of the n-transistor 21 is pulled up to the power supply. In the static mode where both transistors 20, 21 are completely open, the voltage V at the drains of the p- and n-transistors 20, 21 is determined by the ratio $\alpha = \beta n/\beta p$ where $\beta p$ and $\beta n$ are a drain current coefficient or a beta value of p- and n-transistors 20, 21 respectively. The voltage V drops when $\alpha$ increases and grows when $\alpha$ declines. Assuming that p- and n-transistors take the same characteristic in the respective inverters 1, 2, ..., n in the conventional circuit shown in FIG. 1, $$\alpha = \frac{\sum_{i=1}^{n} x_i}{\sum_{i=1}^{n} \bar{x}_i}$$

can be obtained. The threshold function of the majority circuit shown in FIG. 1 can simply be expressed by $$y = \text{Sign}(\alpha - 1) \quad (2)$$

because $$\text{Sign}(\alpha - 1) = \text{Sign}\left(\sum_{i=1}^{n} x_i - \sum_{i=1}^{n} \bar{x}_i\right)$$

$$= \text{Sign}\left(\sum_{i=1}^{n} x_i - \sum_{i=1}^{n} (1 - x_i)\right)$$

$$= \text{Sign}\left(\sum_{i=1}^{n} x_i - \frac{n}{2}\right)$$

can be established. The ratio $\alpha$ is the principle to a threshold element of the present invention.

We will explain below the theorem which the present inventor has found to reduce the number of transistors implementing a threshold circuit.

Theorem

Any threshold function of expression (1) can be represented as follows so as to include a ratio, $$F(X) = \text{Sign}\left(\frac{\sum_{i \notin S} w_i x_i}{\sum_{i \in S} \bar{w}_i x_i} - 1\right) \quad (3)$$

where S is a certain subset of indexes $\underline{i}$, such that $$\Sigma_{i \in S} w_i = T \quad (4)$$

Proof

Since $x_i$ is either of "0" or "1", the following expression $$\sum_{i=1}^{n} w_i x_i - T \quad (5)$$

takes a discrete value in relation to variable combinations of $x_i$. Taking a value $\underline{a}$ closest and larger than "0" among the discrete values, a threshold function never loses its function even if T is replaced with (T−a). This operation allows set $\underline{S}$ of the index $\underline{i}$ to meet the expression (4).

If a set $\underline{S}$ of the index $\underline{i}$ meets the expression (4), then the expression (5) may be transformed as follows:

$$\sum_{i=1}^{n} w_i x_i - T = \sum_{i \notin S} w_i x_i - \left(T - \sum_{i \in S} w_i x_i\right)$$

$$= \sum_{i \notin S} w_i x_i - \sum_{i \in S} w_i (1 - x_i)$$

$$= \sum_{i \notin S} w_i x_i - \sum_{i \in S} w_i \bar{x}_i$$

$$F(X) = \text{Sign}\left(\sum_{i=1}^{n} w_i x_i - T\right)$$

$$= \text{Sign}\left(\sum_{i \notin S} w_i x_i - \sum_{i \in S} w_i \bar{x}_i\right)$$

$$= \text{Sign}\left(\frac{\sum_{i \notin S} w_i x_i}{\sum_{i \in S} w_i \bar{x}_i} - 1\right)$$

This is the end of the proof. However, the above expression can be rearranged to the following expression.

$$F(X) = 1 - \text{Sign}\left(\frac{\sum_{i \in S} w_i \bar{x}_i}{\sum_{i \notin S} w_i x_i} - 1\right)$$

where S is a certain subset of indexes $\underline{i}$, such that $$\sum_{i \in S} w_i = T - 1$$

This rearrangement may be employed in designing a circuit of a three-input C-element as described later.

Figure 3:
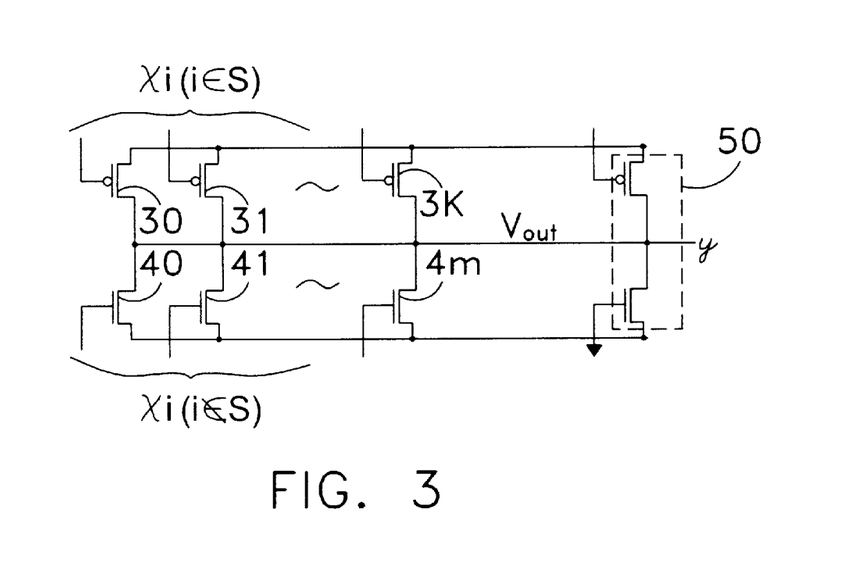
FIG. 3 illustrates a threshold element realizing a certain threshold function in accordance with the theorem which the present inventor has found.

FIG. 3 illustrates a threshold element based on a certain threshold function of the expression (1). As shown in FIG. 3, the threshold element comprises p-transistors 30, 31, ..., 3k for receiving $x_i$ for the index $\underline{i}$ included in the above-mentioned set $\underline{S}$ defined by the expression (4), and n-transistors 40, 41, ..., 4m for receiving $x_i$ for the index $\underline{i}$ outside the set $\underline{S}$. All of the drains from the p- and n-transistors are commonly connected. A decision inverter 50 compares the voltage Vout at the connected drains with a threshold value T so as to output the final result $\underline{y}$.

Taking account of the ratio $\alpha$ in the expression (2), the numerator of the fractional component in the expression (3) is considered to correspond to the n-transistors, and the denominator of the fractional component is likewise to the p-transistors. This tells that a single transistor covers a single input. Accordingly, the threshold element of FIG. 3 can be constructed with a half of transistors employed in a conventional threshold element of output wired CMOS inverters shown in FIG. 1 if the decision inverter 50 is neglected.

The utilization of the above-mentioned designing method allows a threshold element of a three-input Boolean calculation such as xyz, x(y+z), xy+yz+zx, x+yz, and x+y+z to be realized with four transistor and a single inverter, namely, six transistors in total.

xyz Arithmetic

A Boolean calculation of xyz can be expressed by a threshold function, F=Sign(x+y+z−3), which may be rearranged to $$F = \text{Sign}\left(\frac{\varepsilon}{\overline{x}+\overline{y}+\overline{z}} - 1\right)$$

where $\varepsilon$ is a transistor of a smaller beta value, which is called a "weak transistor" hereinafter. It is adapted to prevent the floating of the output voltage Vout and brought in for convenient designing. It should be noted that transformation can be effected to the threshold function in variable manners.

Figure 4:
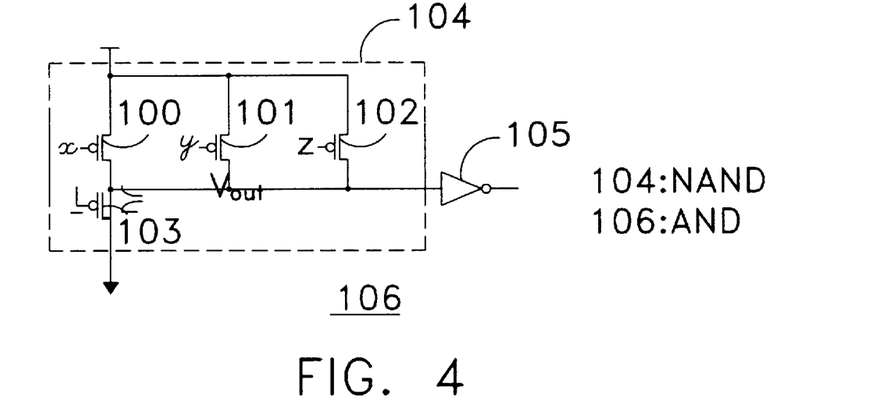
FIG. 4 illustrates the structure of the threshold element corresponding to xyz arithmetic.

FIG. 4 illustrates a threshold element corresponding to xyz implementation. The x-, y- and z-inputs are connected to the bases of p-transistors 100, 101, 102 of the same beta value. The drains of p-transistors 100, 101, 102 are commonly connected to the drain of an n-transistor 103 corresponding to a weak transistor $\varepsilon$ which keeps open. Four transistors 100–103 form an NAND-gate 104. The analog output voltage Vout appears at the connected drains of four transistors 100–103. A decision inverter 105 is disposed at the stage subsequent to the NAND-gate 104 so as to binary-code the output voltage Vout. The whole circuit forms an AND-gate 106.

x(y+z) Arithmetic

A Boolean calculation of x(y+z) can be expressed by a threshold function, F=Sign(2x+y+z−3), which may be rearranged to the following expression.

$$F = \text{Sign}\left(\frac{z+\varepsilon}{2\overline{x}+\overline{y}} - 1\right)$$

Figure 5:
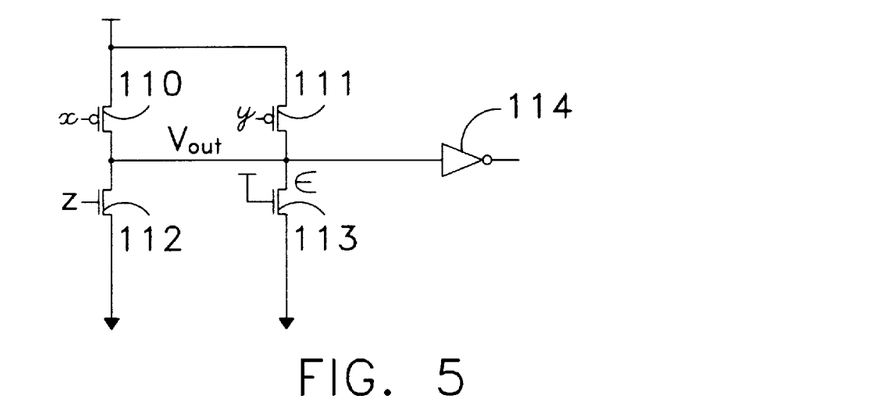
FIG. 5 illustrates the structure of the threshold element corresponding to x(y+z) arithmetic.

FIG. 5 illustrates a threshold element corresponding to x(y+z) implementation. The x- and y-inputs are connected to the bases of p-transistors 110, 111, while the z-input is connected to the base of an n-transistor 112. The drains of p- and n-transistors 110–112 are commonly connected to the drain of an n-transistor 113 corresponding to the weak transistor $\varepsilon$ which keeps open. The beta value of the p-transistor 110 which receives the x-input is set at twice the beta value of the other transistors 111, 112 so as to reflect the weight of the transistor 110. The output voltage Vout appears at the connected drains of four transistors 110–113 and is supplied to a decision inverter 114.

xy+yz+zx Arithmetic

This is a three-input majority circuit. A Boolean calculation of xy+yz+zx can be expressed by a threshold function, F=Sign(x+y+z−2), which may be rearranged to the following expression.

$$F = \text{Sign}\left(\frac{z+\varepsilon}{\overline{x}+\overline{y}} - 1\right)$$

The structure of the corresponding threshold element is the same as of FIG. 5. Here, the beta value of the n-transistor 110 which receives the x-input is set at the same level as the other transistors 111, 112.

x+y+z Arithmetic

A Boolean calculation of x+y+z can be expressed by a threshold function, F=Sign(x+y+z−1), which may be rearranged to the following expression.

$$F = \text{Sign}\left(\frac{y+z+\varepsilon}{\overline{x}} - 1\right)$$

Figure 6:
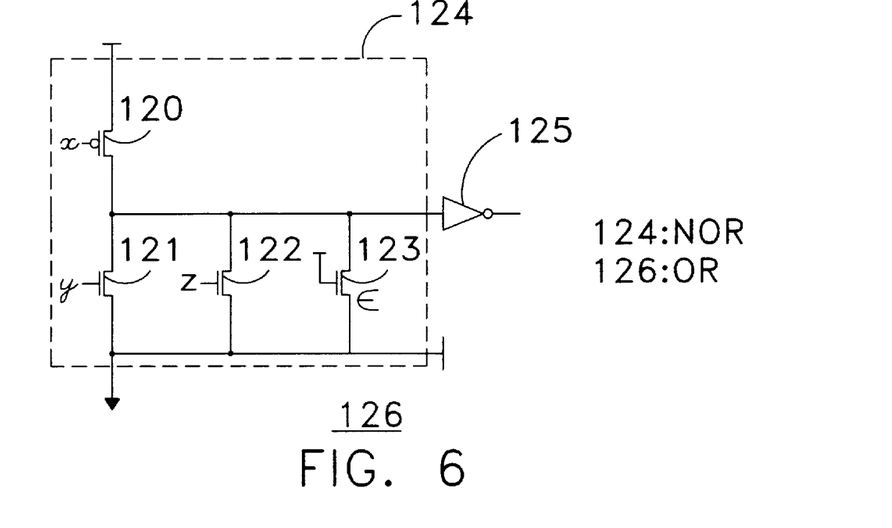
FIG. 6 illustrates the structure of the threshold element corresponding to x+y+z arithmetic.

FIG. 6 illustrates a threshold element corresponding to x+y+z implementation. The x-input is connected to the base of a p-transistor 120, while the y- and z-inputs are connected to the bases of n-transistors 121, 122. The drains of the p- and n-transistors 120–122 are commonly connected to the drain of an n-transistor 123 corresponding to the weak transistor $\varepsilon$ which keeps open. Four transistors 120–123 form an NOR-gate 124 having analog output. The output voltage Vout appears at the connected drains of four transistors 120–123. A decision inverter 125 is disposed at the stage subsequent to the NOR-gate 124 so as to binary-code the output voltage Vout. The whole circuit forms an OR-gate 126.

x+yz Arithmetic

A Boolean calculation of x+yz can be expressed by a threshold function, F=Sign(2x+y+z−2), which may be rearranged to the following expression.

$$F = \text{Sign}\left(\frac{y+z+\varepsilon}{2\overline{x}} - 1\right)$$

The structure of the corresponding threshold element is the same as of FIG. 6. Here, the beta value of the p-transistor 120 which receives the x-input is set at twice the beta value of the other transistors 121, 122.

The description has been made to five examples of Boolean calculation circuits. According to the present invention, a three-input Boolean calculation circuit can be formed with a combination of transistors equal to or less than eleven and inverters equal to or less than two, namely, transistors equal to or less than fifteen in total. A three-input Boolean calculation may be established by a combination of any of four bases such as xyz, $xy\overline{z}$, $x\overline{yz}$, and $\overline{xyz}$, so that the following examples can be implemented.

xyz Arithmetic

As described above, the threshold element of FIG. 4 corresponds to xyz implementation. Six transistors are used in total. As of $\overline{xyz}$, the threshold function can be expressed by F=1−Sign(x+y+z−3), so that an inverter may be added to the later stage of the AND-gate 106 of FIG. 4.

$xy\overline{z}$ Arithmetic

Figure 7:
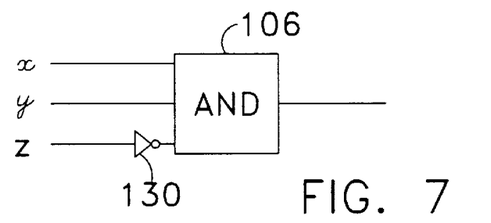
FIG. 7 illustrates the structure of the threshold element corresponding to $xy\bar{z}$ arithmetic.

FIG. 7 illustrates a threshold element corresponding to this logic. This can be implemented with the z-input of FIG. 4 inverted by an inverter 130. Eight transistors are used in total. The AND-gate 106 in FIG. 4 is also used in FIG. 7. The threshold function may be expressed by F=Sign(x+y+$\overline{z}$−3). Since $$\overline{xy\overline{z}}$$

can be expressed by F=1−Sign(x+y+$\overline{z}$−3), the corresponding threshold element may be implemented by inserting an inverter after the AND-gate 106 in FIG. 7.

$\overline{x\overline{y}z}$ Arithmetic

Figure 8:
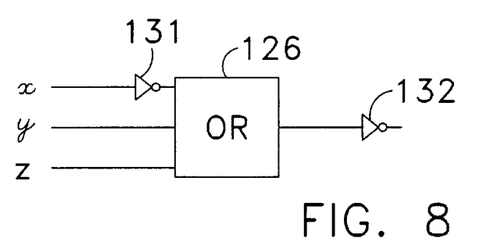
FIG. 8 illustrates the structure of the threshold element corresponding to $x\overline{yz}$ arithmetic.

Since a Boolean calculation of $\overline{x\overline{y}z}$ is equal to $$\overline{x}+y+z,$$

the corresponding threshold function may be expressed by $F=Sign(x+\overline{y}+\overline{z}-3)=1-Sign(\overline{x}+y+z-1)$. FIG. 8 illustrates a circuit utilizing the OR-gate 126 in FIG. 6. When the OR-gate 126 is used, the x-input is inverted by an inverter 131 and the output from the OR-gate 126 is inverted by an inverter 132. Ten transistors are used in total.

Since $$\overline{x\overline{y}\overline{z}}$$

can be expressed by $F=1-Sign(x+\overline{y}+\overline{z}-3)$, the corresponding threshold element maybe implemented by inserting an inverter after the inverter 132 in FIG. 8.

$\overline{\overline{x}yz}$ Arithmetic

Figure 9:
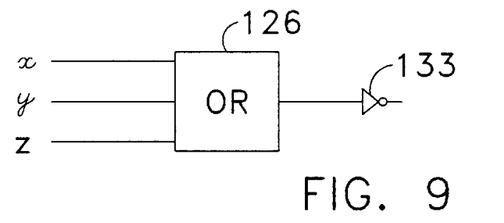
FIG. 9 illustrates the structure of the threshold element corresponding to $\overline{xyz}$ arithmetic.

Since a Boolean calculation of $\overline{\overline{x}yz}$ is equal to $$x+\overline{y}+\overline{z},$$

the corresponding threshold function may be expressed by $F=Sign(\overline{x}+\overline{y}+\overline{z}-3)=1-Sign(x+y+z-1)$. FIG. 9 illustrates a circuit utilizing the OR-gate 126 in FIG. 6. When the OR-gate 126 is used, the output from the OR-gate 126 is inverted by an inverter 133. Eight transistors are used in total.

Since $$\overline{\overline{x}\overline{y}\overline{z}}$$

can be expressed by $F=1-Sign(\overline{x}+\overline{y}+\overline{z}-3)$, the corresponding threshold element may be implemented by adding an inverter after the inverter 133 in FIG. 9.

xyz+x$\overline{y}\overline{z}$ Arithmetic

Figure 10:
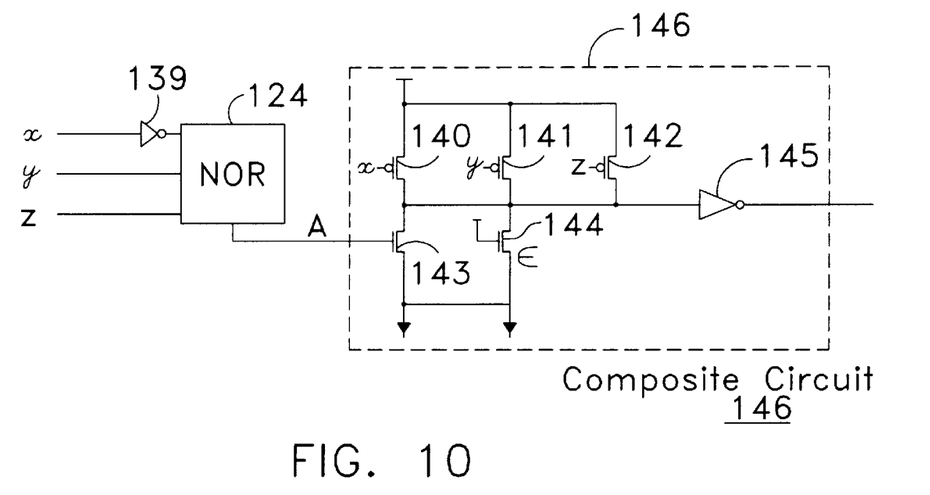
FIG. 10 illustrates the structure of the threshold element corresponding to $xyz+\overline{xyz}$ arithmetic.

FIG. 10 illustrates a circuit of xyz+x$\overline{y}\overline{z}$ implementation. First, A=x$\overline{y}\overline{z}$ is made.

Since $$A = \overline{x}+y+z,$$

the x-input of the NOR-gate 124 is inverted by an inverter 139. This is the first stage of the circuit. The threshold function would be: The x-, y- and z-inputs are respectively connected to the drains $$F = \text{Sign}(xyz + A - 1) \tag{6}$$

$$= \text{Sign}(x+y+z+3A-3)$$

$$= \text{Sign}\left(\frac{3A+\varepsilon}{\overline{x}+\overline{y}+\overline{z}}-1\right)$$

of p-transistors 140, 141, 142 at the second stage. The logic A is connected to the drain of an n-transistor 143 in parallel with a weak n-transistor 144 which keep open. The beta value of the n-transistor 143 which receives the logic A is set at thrice the beta value of the other transistors 140–142. The drains of five transistors 140–144 are commonly connected, and the output voltage Vout appears at the connected drains. A decision inverter 145 is disposed after the drains, so that the whole second stage forms a composite circuit 146 corresponding to the expression (6).

The input A to the composite circuit 146 is an analog signal. The proper operation of the circuit 146 has been confirmed by circuit simulation if the characteristic of transistors are appropriately managed. Thirteen transistors are used in total.

Since $$\overline{xyz + x\overline{y}\overline{z}}$$

can be expressed by $F=1-Sign(x+y+z+3x\overline{y}\overline{z}-3)$, the corresponding threshold element may be implemented by adding an inverter after the circuit in FIG. 10. Fifteen transistors are required in total.

$\overline{x}yz+\overline{x}\overline{y}z$ Arithmetic

Figure 11:
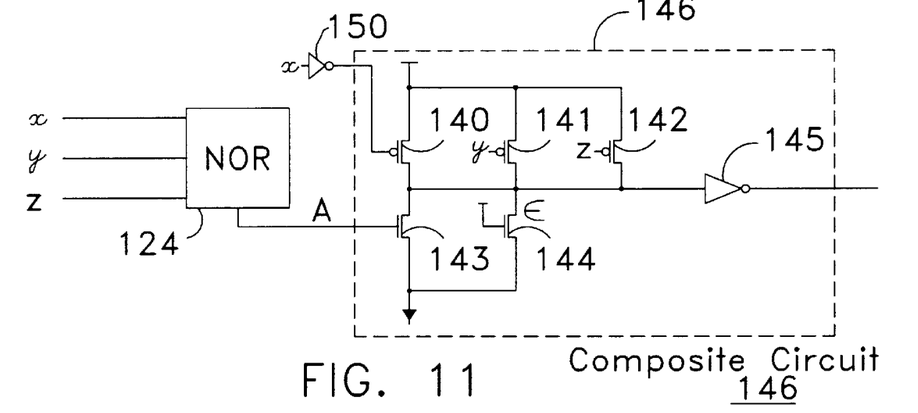
FIG. 11 illustrates the structure of the threshold element corresponding to $\bar{x}yz+\overline{xyz}$ arithmetic.

The corresponding threshold function may be expressed by $F=Sign(\overline{x}yz+\overline{x}\overline{y}z-1)$, a circuit of which is illustrated in FIG. 11. The circuit eliminates the inverter 140 of FIG. 10 for inverting the x-input at the first stage, while it includes an inverter 150 for inverting the x-input at the second stage. Thirteen transistors are used in total.

Since $$\overline{\overline{x}yz + \overline{x}\overline{y}z}$$

can be expressed by $F=1-Sign(\overline{x}+y+z+3\overline{x}\overline{y}z-3)$, the corresponding threshold element may be implemented by adding an inverter after the circuit in FIG. 11.

xyz+$\overline{x}\overline{y}z$ Arithmetic

Figure 12:
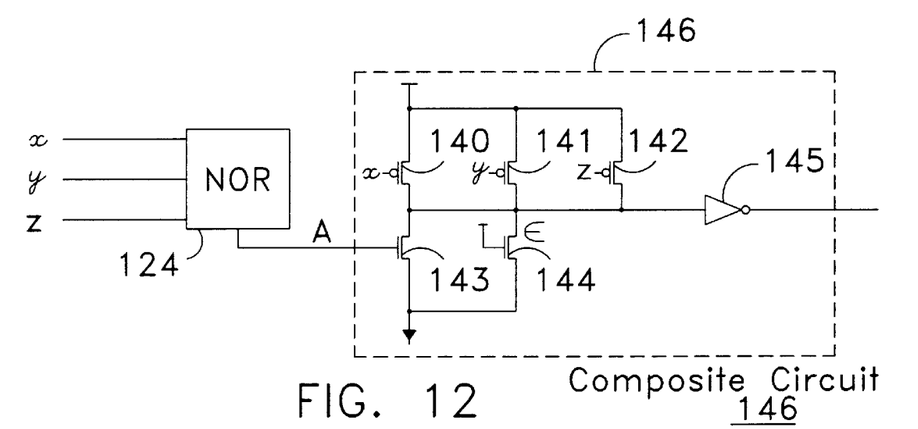
FIG. 12 illustrates the structure of the threshold element corresponding to $xyz+\overline{xyz}$ arithmetic.

The corresponding threshold function may be expressed by $F=Sign(xyz+\overline{x}\overline{y}z-1)$, a circuit of which is illustrated in FIG. 12. The circuit simply eliminates the inverter 140 of FIG. 10 for inverting the x-input at the first stage. Eleven transistors are used in total.

Since $$\overline{xyz + \overline{x}\overline{y}z}$$

can be expressed by $F=1-Sign(x+y+z+3\overline{x}\overline{y}z-3)$, the corresponding threshold element may be implemented by adding an inverter after the circuit in FIG. 12.

C-element

Figure 13:
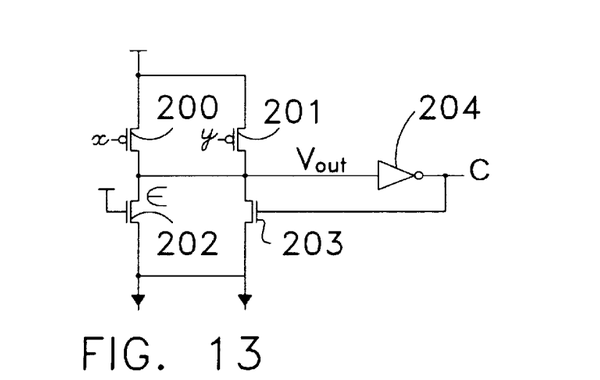
FIG. 13 illustrates the structure of the threshold element corresponding to a two-input C-element.

The present invention may be applied to the types of calculation other than simple Boolean calculations. FIG. 13 illustrates the structure of a circuit called a two-input C-element with x- and y-inputs. C-elements are widely used as synchronizing devices in asynchronous circuits. It is regarded as a majority circuit with hysteresis. When C=0 in a two-input C-element, the x- and y-inputs both reaching "1" allows C=1. On the other hand, when C=1, the x- and y-inputs both coming to "0" allows C=0. The behavior of a two-input C-element is specified by a threshold function:

$$C(x, y) = \text{Sign}(x+y+C-2) = \text{Sign}\left(\frac{C+\varepsilon}{\overline{x}+\overline{y}}-1\right)$$

Accordingly, the x- and y-inputs are connected to the bases of p-transistors 200, 201, respectively. The drains of a weak n-transistor 202 which keeps open and an n-transistor 203 which receives the output C at the base are commonly connected to the drains of the p-transistors 200, 201. The output voltage Vout appears at the connected drains. The output voltage Vout is supplied to a decision inverter 204 so as to provide a target C. The two-input C-element can be implemented with six transistors, while the similar implementation of a two-input C-element in a CMOS circuitry requires eight transistors.

Figure 14:
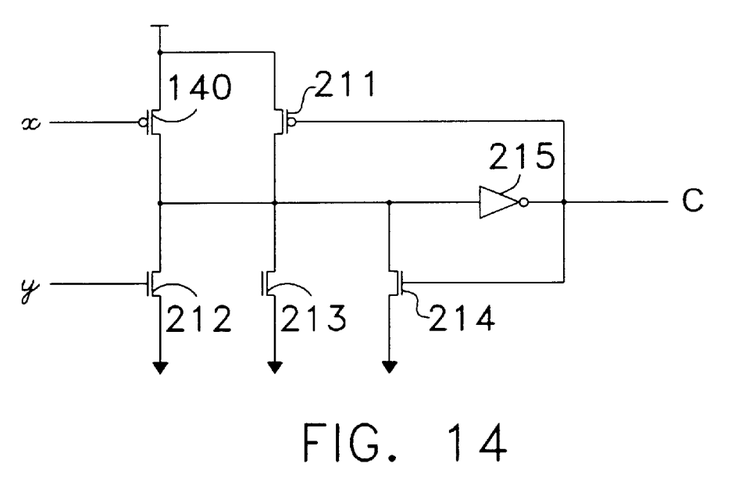
FIG. 14 illustrates the structure of the threshold element corresponding to a three-input C-element.

FIG. 14 illustrates the structure of a three-input C-element with x-, y- and z-inputs. When C=0 in this element, the x-, y- and z-inputs all reaching "1" allows C=1, while the x-, y- and z-inputs all coming to "0" allows C=0 when C=1. The behavior of a three-input C-element is specified by a threshold function:

$$C(x, y, z) = \text{Sign}(x + y + z + 2C - 3) = 1 - \text{Sign}\left(\frac{\bar{x} + \bar{C}}{y + z + C} - 1\right)$$

Accordingly, the x-input and output C are connected to the bases of p-transistors 210, 211, respectively. The y- and x-inputs and output C are connected to the bases of n-transistors 212, 213, 214, respectively. All drains of n- and p-transistors 210–214 are commonly connected to form the output voltage Vout. Since either of p-transistor 211 or n-transistor 214 should inevitably open, a weak transistor is not necessary to keep the level of the output voltage Vout. The output voltage Vout is supplied to a decision inverter 215 so as to give a target C. The three-input C-element can be implemented with seven transistors, while the similar implementation of a three-input C-element in a conventional CMOS circuitry requires ten transistors.

Figure 15:
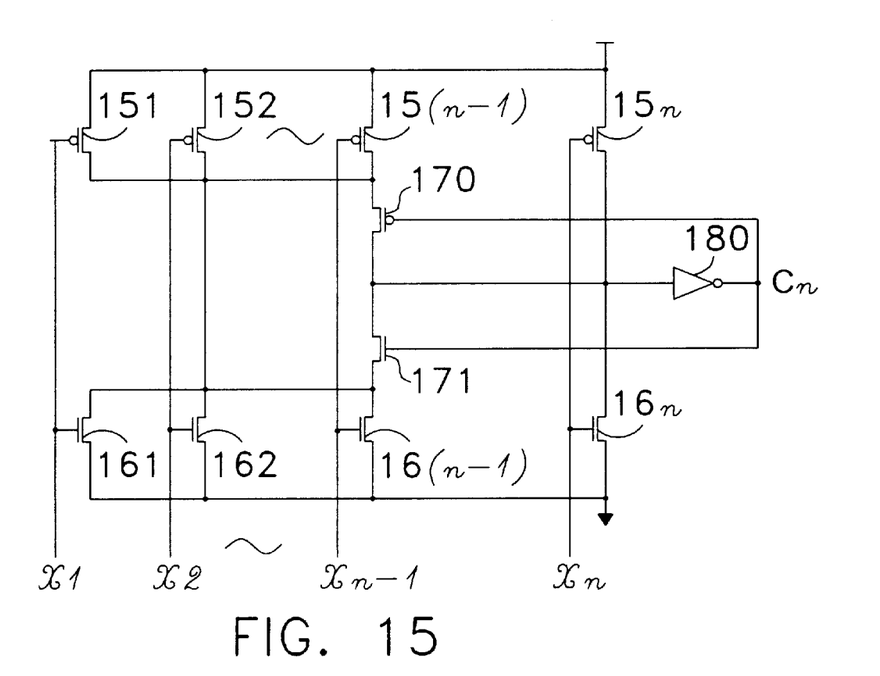
FIG. 15 illustrates the structure of the threshold element corresponding to an n-input C-element.

FIG. 15 illustrates the structure of an n-input C-element. The corresponding threshold function can be generalized as:

$$C(X) = 1 - \text{Sign}\left(\frac{\bar{C}\sum_{i=1}^{n-1} \bar{x}_i + 0.5\bar{x}_n}{C\sum_{i=1}^{n-1} x_i + 0.5x_n} - 1\right)$$

Accordingly, the $x_1$- to $x_n$-inputs are connected to p-transistors 151–15n and n-transistors 161–16n. The drains of all the p-transistors 151–15(n–1) are commonly connected while the drains of all the n-transistors 161–16(n–1) are commonly connected.

A p-transistor 170 and an n-transistor 171 are serially connected between the drains of the p- and n-transistors 15(n–1), 16(n–1) corresponding to the $x_{n-1}$-input. The drains of the p- and n-transistors 170, 171 are connected to the drains of the p- and n-transistors 15n, 16n corresponding to the $x_n$-input, which in turn are connected to a decision inverter 180. The feedback from the output of the decision inverter 180 is connected to the drains of the serially connected p- and n-transistors 170, 171. When C=1 in the n-input C-element, all inputs assuming "0" allows C=0, while all inputs reaching "1" allows C=1 when C=0.

Full Adder

Figure 16:
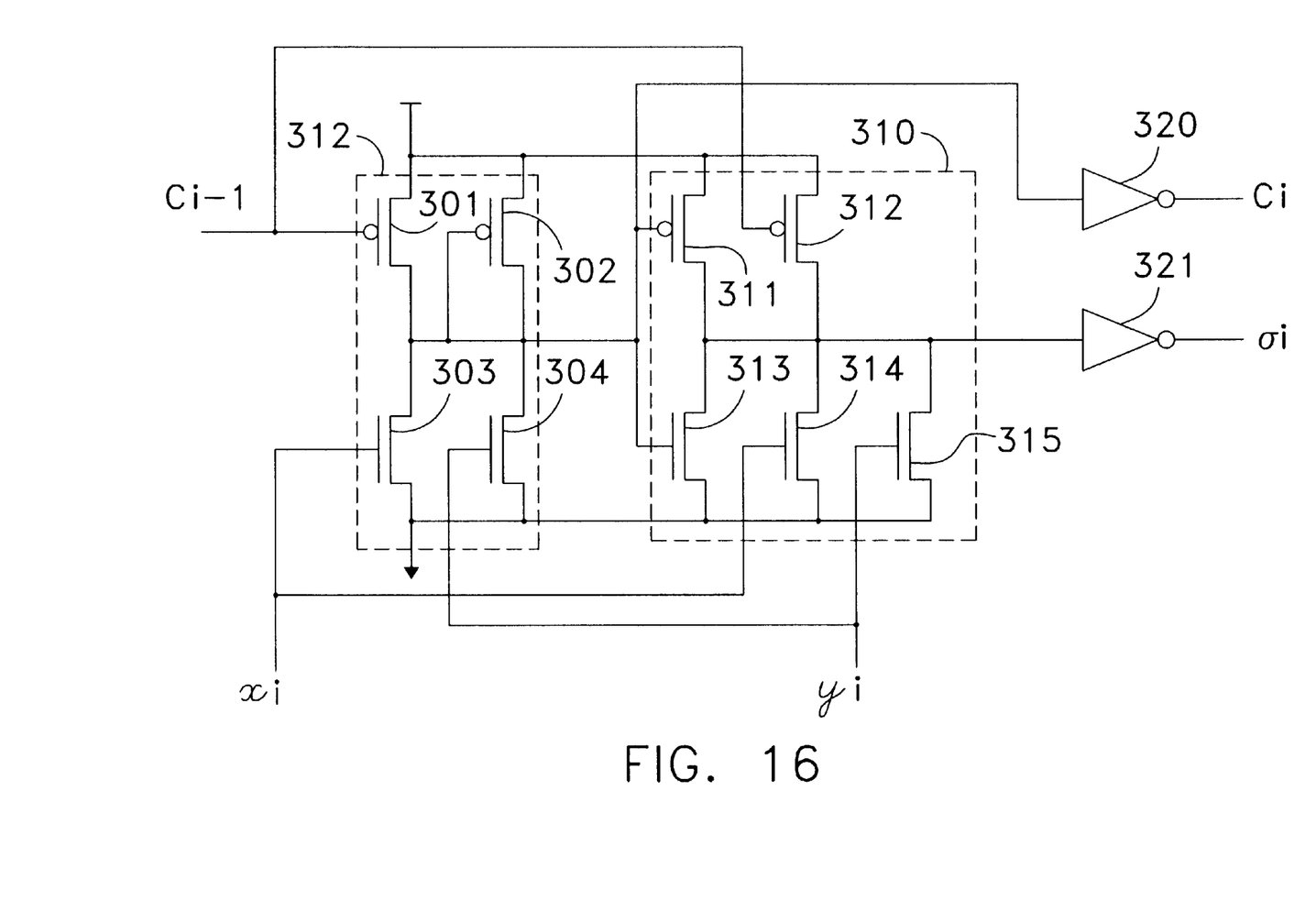
FIG. 16 illustrates the structure of the threshold element corresponding to a full adder.

FIG. 16 illustrates a threshold element of a full adder as another example. The full adder receives a carrier $C_{i-1}$ from the ahead stage, and sums $x_i$- and $y_i$-inputs, to give the sum $\sigma_i$ and the carrier $C_i$. Threshold representation of a full adder is:

$$C_i = \text{maj}(x_i, y_i, C_{i-1}); \quad (7)$$

$$\bar{C}_i = \text{Sign}\left(\frac{C_{i-1} + \varepsilon}{x_i + y_i} - 1\right)$$

and $$\sigma_i = \text{Sign}(x_i + y_i + C_{i-1} - 2C_i - 1) = \text{Sign}(x_i + y_i C_{i-1} + 2\bar{C}_i - 3);$$

$$\bar{\sigma}_i = \text{Sign}\left(\frac{\bar{C}_{i-1} + \bar{C}_i}{x_i + y_i + \bar{C}_i} - 1\right) \quad (8)$$

According to the representation (7), a circuit 300 generating $\bar{C}_i$ includes a p-transistor 301 receiving the carrier $C_{i-1}$ at the gate. A weak p-transistor 302 is disposed in parallel to the p-transistor 301 for keeping open. The $x_i$- and $y_i$-inputs are respectively connected to the gates of n-transistors 303, 304. The drains of these transistors 301–304 are commonly connected. The signal $\bar{C}_i$ appears at the connected drains, to form $C_i$ through an inverter 320.

On the other hand, according to the expression (8), a circuit 310 generating $\bar{\sigma}_i$ includes p-transistors 311, 312 receiving $\bar{C}_i$, and $C_{i-1}$ at the gate. The $x_i$- and $y_i$-inputs and $\bar{C}_i$ are respectively connected to the gates of n-transistors 313, 314, 315. The drains of these transistors 311–315 are commonly connected. The signal $\bar{\sigma}_i$ appears at the connected drains, to form $\sigma_i$ through an inverter 321.

As described above, a full adder of the present invention employs nine transistors (with two inverters), while a similar implementation of a full adder in a conventional CMOS circuitry requires twenty transistors (plus two inverters). The scale of the circuitry can be reduced in the present invention.

What is claimed is:

1. A method of designing a threshold element, comprising:

transforming to a form including a ratio of a parameter related to p- and n-transistors a threshold function which outputs a result of comparison between a predetermined threshold value and a sum of weighted inputs; and designing a threshold element corresponding to the threshold function by allocating the inputs to the p- and n-transistors in accordance with the ratio, wherein said parameter is a drain current coefficient of the transistor, and wherein said threshold function is transformed to a form of Sign ((the ratio of drain current coefficient) –1).

2. A threshold element comprising:

a p-transistor receiving an input allocated in accordance with a predetermined ratio; and an n-transistor receiving an input allocated in accordance with the ratio, wherein said ratio is included in a transformed form of a threshold function which outputs a result of comparison between a predetermined threshold value and a sum of the inputs, said ratio representing a parameter related to the p- and n-transistors, and wherein said transformed form includes Sign ((said ratio) –1).

3. The threshold element according to claim 2, wherein said parameter is a drain current coefficient of the transistor.

4. A threshold element comprising.

a p-transistor receiving an input allocated in accordance with a predetermined ratio; and an n-transistor receiving an input allocated in accordance with the ratio, wherein said ratio is included in a transformed form of a threshold function which outputs a result of comparison between a predetermined threshold value and a sum of the inputs, said ratio representing a parameter related to the p- and n-transistors, the threshold element implementing a Boolean calculation of x(y+z) based on said threshold function comprising F=Sign(2x+y+z–3).

5. A threshold element comprising:

a p-transistor receiving an input allocated in accordance with a predetermined ratio; and an n-transistor receiving an input allocated in accordance with the ratio, wherein said ratio is included in a transformed form of a threshold function which outputs a result of comparison between a predetermined threshold value and a sum of the inputs, said ratio representing a parameter related to the p- and n-transistors, the threshold element implementing a Boolean calculation of xy+yz+zx based on said threshold function comprising F=Sign (x+y+z−2).

6. A threshold element comprising:

a p-transistor receiving an input allocated in accordance with a predetermined ratio; and an n-transistor receiving an input allocated in accordance with the ratio, wherein said ratio is included in a transformed form of a threshold function which outputs a result of comparison between a predetermined threshold value and a sum of the inputs, said ratio representing a parameter related to the p- and n-transistors, the threshold element implementing a Boolean calculation of x+yz based on said threshold function comprising F=Sign (2x+y+z−2).

7. A threshold element comprising:

a p-transistor receiving an input allocated in accordance with a predetermined ratio; and an n-transistor receiving an input allocated in accordance with the ratio, wherein said ratio is included in a transformed form of a threshold function which outputs a result of comparison between a predetermined threshold value and a sum of the inputs, said ratio representing a parameter related to the p- and n-transistors, the threshold element implementing a Boolean calculation of $xy\bar{z}$ based on said threshold function comprising F=Sign (x+y+$\bar{z}$−3).

8. A threshold element comprising:

a p-transistor receiving an input allocated in accordance with a predetermined ratio; and an n-transistor receiving an input allocated in accordance with the ratio, wherein said ratio is included in a transformed form of a threshold function which outputs a result of comparison between a predetermined threshold value and a sum of the inputs, said ratio representing a parameter related to the p- and n-transistors, the threshold element implementing a Boolean calculation of $x\bar{y}\bar{z}$ based on said threshold function comprising F=Sign (x+$\bar{y}$+$\bar{z}$−3).

9. A threshold element comprising:

a p-transistor receiving an input allocated in accordance with a predetermined ratio; and an n-transistor receiving an input allocated in accordance with the ratio, wherein said ratio is included in a transformed form of a threshold function which outputs a result of comparison between a predetermined threshold value and a sum of the inputs, said ratio representing a parameter related to the p- and n-transistors, the threshold element implementing a Boolean calculation of $\overline{xyz}$ based on said threshold function comprising F=Sign ($\bar{x}$+$\bar{y}$+$\bar{z}$−3).

10. A threshold element comprising:

a p-transistor receiving an input allocated in accordance with a predetermined ratio; and an n-transistor receiving an input allocated in accordance with the ratio, wherein said ratio is included in a transformed form of a threshold function which outputs a result of comparison between a predetermined threshold value and a sum of the inputs, said ratio representing a parameter related to the p- and n-transistors, the threshold element implementing a Boolean calculation of xyz+$x\overline{yz}$ based on said threshold function comprising F=Sign (xyz+$x\overline{yz}$−1).

11. A threshold element comprising:

a p-transistor receiving an input allocated in accordance with a predetermined ratio; and an n-transistor receiving an input allocated in accordance with the ratio, wherein said ratio is included in a transformed form of a threshold function which outputs a result of comparison between a predetermined threshold value and a sum of the inputs, said ratio representing a parameter related to the p- and n-transistors, the threshold element implementing a Boolean calculation of $\overline{x}yz$+$\overline{xyz}$ based on said threshold function comprising F=Sign ($\overline{x}yz$+$\overline{xyz}$−1).

12. A threshold element comprising:

a p-transistor receiving an input allocated in accordance with a predetermined ratio; and an n-transistor receiving an input allocated in accordance with the ratio, wherein said ratio is included in a transformed form of a threshold function which outputs a result of comparison between a predetermined threshold value and a sum of the inputs, said ratio representing a parameter related to the p- and n-transistors, the threshold element implementing a Boolean calculation of xyz+$\overline{xyz}$ based on said threshold function comprising F=Sign (xyz+$\overline{xyz}$−1).

13. A threshold element comprising:

a p-transistor receiving an input allocated in accordance with a predetermined ratio; and an n-transistor receiving an input allocated in accordance with the ratio, wherein said ratio is included in a transformed form of a threshold function which outputs a result of comparison between a predetermined threshold value and a sum of the inputs, said ratio representing a parameter related to the p- and n-transistors, the threshold element implementing a Boolean calculation of $\overline{xyz}$ based on said threshold function comprising F=1−Sign (x+y+z−3).

14. A threshold element comprising:

a p-transistor receiving an input allocated in accordance with a predetermined ratio; and an n-transistor receiving an input allocated in accordance with the ratio, wherein said ratio is included in a transformed form of a threshold function which outputs a result of comparison between a predetermined threshold value and a sum of the inputs, said ratio representing a parameter related to the p- and n-transistors, the threshold element implementing a Boolean calculation of $$\overline{xy\bar{z}}$$

based on said threshold function comprising F=1−Sign (x+y+$\bar{z}$−3).

15. A threshold element comprising:

a p-transistor receiving an input allocated in accordance with a predetermined ratio; and an n-transistor receiving an input allocated in accordance with the ratio, wherein said ratio is included in a transformed form of a threshold function which outputs a result of comparison between a predetermined threshold value and a sum of the inputs, said ratio representing a parameter related to the p- and n-transistors, the threshold element implementing a Boolean calculation of $$\overline{xyz}$$

based on said threshold function comprising F=1−Sign (x+$\overline{y}$+$\overline{z}$−3).

16. A threshold element comprising:
a p-transistor receiving an input allocated in accordance with a predetermined ratio; and
an n-transistor receiving an input allocated in accordance with the ratio, wherein said ratio is included in a transformed form of a threshold function which outputs a result of comparison between a predetermined threshold value and a sum of the inputs, said ratio representing a parameter related to the p- and n-transistors, the threshold element implementing a two-input C-element with x- and y-inputs based on said threshold function comprising C=Sign (x+y+C−2).

17. A threshold element comprising:
a p-transistor receiving an input allocated in accordance with a predetermined ratio; and
an n-transistor receiving an input allocated in accordance with the ratio, wherein said ratio is included in a transformed form of a threshold function which outputs a result of comparison between a predetermined threshold value and a sum of the inputs, said ratio representing a parameter related to the p- and n-transistors, the threshold element implementing a three-input C-element with x-, y- and z-inputs based on said threshold function comprising C=Sign (x+y+z+2C−3).

18. A threshold element comprising:
a p-transistor receiving an input allocated in accordance with a predetermined ratio; and
an n-transistor receiving an input allocated in accordance with the ratio, wherein said ratio is included in a transformed form of a threshold function which outputs a result of comparison between a predetermined threshold value and a sum of the inputs, said ratio representing a parameter related to the p- and n-transistors, the threshold element implementing an n-input C-element with $x_1$-, $x_2$-, . . . , $x_n$-inputs based on said threshold function comprising $$C = 1 - \text{Sign}\left(\frac{\overline{C}\sum_{i=1}^{n-1}\overline{x}_i + 0.5\overline{x}_n}{C\sum_{i=1}^{n-1}x_i + 0.5x_n} - 1\right).$$

19. A threshold element comprising:
a p-transistor receiving an input allocated in accordance with a predetermined ratio; and
an n-transistor receiving an input allocated in accordance with the ratio, wherein said ratio is included in a transformed form of a threshold function which outputs a result of comparison between a predetermined threshold value and a sum of the inputs, said ratio representing a parameter related to the p- and n-transistors, the threshold element implementing a full adder with $x_i$- and $y_i$-inputs, a carry-in $C_{i-1}$, a carry-out $C_i$, and a sum result $\sigma_i$ based on said threshold function comprising $$\overline{C}_i = \text{Sign}\left(\frac{C_{i-1}+\varepsilon}{x_i+y_i} - 1\right) \text{ and}$$

$$\overline{\sigma}_i = \text{Sign}\left(\frac{\overline{C}_{i-1}+\overline{C}_i}{x_i+y_i+\overline{C}_i} - 1\right)$$

where $\varepsilon$ is a value corresponding to a transistor introduced for convenient designing.

* * * * *